United States Patent
Aoyama

(10) Patent No.: US 8,199,868 B2
(45) Date of Patent: Jun. 12, 2012

(54) CLOCK AND DATA RECOVERY CIRCUIT

(75) Inventor: Morishige Aoyama, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 1002 days.

(21) Appl. No.: 12/081,102

(22) Filed: Apr. 10, 2008

(65) Prior Publication Data

US 2008/0253494 A1 Oct. 16, 2008

(30) Foreign Application Priority Data

Apr. 13, 2007 (JP) ................................. 2007-105959

(51) Int. Cl.
*H03D 3/24* (2006.01)
(52) U.S. Cl. ........ 375/373; 375/354; 375/359; 375/362; 375/371; 375/375; 327/145; 327/156
(58) Field of Classification Search .................. 375/215, 375/294, 326, 327, 344, 345, 349, 350, 362, 375/371, 373, 375, 376, 260, 316
See application file for complete search history.

(56) References Cited

U.S. PATENT DOCUMENTS

| | | | | |
|---|---|---|---|---|
| 6,903,587 B2 * | 6/2005 | Sasaki et al. | ................. | 327/165 |
| 7,099,382 B2 * | 8/2006 | Aronson et al. | ............. | 375/219 |
| 7,336,755 B1 * | 2/2008 | Tetzlaff | ........................ | 375/376 |
| 7,519,140 B2 * | 4/2009 | Yoshimura | .................... | 375/376 |
| 7,574,146 B2 * | 8/2009 | Chiang et al. | ................. | 398/209 |
| 7,636,387 B2 * | 12/2009 | Yamaguchi et al. | .......... | 375/224 |
| 2004/0252804 A1 * | 12/2004 | Aoyama | ...................... | 375/376 |
| 2006/0056564 A1 * | 3/2006 | Takeuchi | ..................... | 375/376 |
| 2007/0018745 A1 * | 1/2007 | Knotts et al. | ................. | 331/179 |

FOREIGN PATENT DOCUMENTS

| | | |
|---|---|---|
| JP | 2005-5999 | 1/2005 |
| JP | 2006-80991 | 3/2006 |

* cited by examiner

*Primary Examiner* — Hirdepal Singh
(74) *Attorney, Agent, or Firm* — McGinn IP Law Group, PLLC

(57) ABSTRACT

The phase detector compares the phase of a synchronous clock signal from the clock interpolator with the phase of serial data and outputs a phase error signal corresponding to a comparison result. The first integrator performs integration of the phase error signal and obtains a phase correction control signal for tracking phase shift of the serial data. The second integrator further performs integration of the phase correction control signal and obtains an up/down signal. The pattern generator generates a frequency correction control signal for tracking frequency shift of the serial data from the up/down signal. The product of the pattern length of the pattern generator and the count width of the second integrator is equal to or larger than a threshold that becomes larger as the count width of the first integrator is larger.

4 Claims, 12 Drawing Sheets

CLOCK AND DATA RECOVERY CIRCUIT

BACKGROUND OF THE INVENTION

1. Field of the Invention

The present invention relates to a technique of extracting a synchronous clock signal from input data in an LSI at the receiving end in the serial transmission of data between LSIs.

2. Description of Related Art

With the progress of semiconductor technology, data transmission between LSIs is serialized. In order to reduce electromagnetic interface (EMI) in the serial data transmission, there is known a technique of performing frequency modulation using a spread spectrum clock in an LSI at the transmitting end and then extracting a clock from frequency-modulated serial data by a clock and data recovery circuit in an LSI at the receiving end (cf. Japanese Unexamined Patent Application Publication Nos. 2005-5999 and 2006-80991)

FIG. 11 is the illustration shown in FIG. 1 of Japanese Unexamined Patent Application Publication No. 2005-5999, and it shows the clock and data recovery circuit which is disclosed therein. The clock and data recovery circuit includes a phase detector 101, an integrator 102, an integrator 103, a pattern generator 104, a mixer 105, and a phase interpolator 106. The phase detector 101 compares the phase of input serial data with the phase of a clock signal which is output from the phase interpolator 106 and outputs a comparison result. Based on the comparison result, a frequency tracking loop which is formed by the integrator 103 and the pattern generator 104 tracks the phase shift at low frequencies or the frequency shift, and a phase tracking loop which is formed by the integrator 102 tracks the phase shift at high frequencies which cannot be tracked by the frequency tracking loop. The mixer 105 mixes the results of the frequency tracking loop and the phase tracking loop. Based on the mixture result, the phase of the synchronous clock signal which is output from the phase interpolator 106 is controlled, thereby extracting the synchronous clock of the serial data.

The phase detector 101 detects a difference in phase between the serial data and the synchronous clock signal and outputs an up signal or a down signal which indicates the difference as a comparison result. The integrator 102 and the integrator 103 are up/down counters that smooth the comparison result and output them as control signals. The integrator 102 and the integrator 103 each have a predetermined count width. The pattern generator 104 generates a control signal UP4/DOWN4 for correcting the frequency of the clock signal based on the control signal UP3/DOWN3 which is output from the integrator 103.

FIG. 12 is the illustration shown in FIG. 10 of Japanese Unexamined Patent Application Publication No. 2005-5999, and it shows another clock and data recovery circuit which is disclosed therein. The clock and data recovery circuit is different from the clock and data recovery circuit shown in FIG. 11 in that the frequency tracking loop and the phase tracking loop share the integrator 102.

FIG. 13 is the illustration shown in FIG. 7 of Japanese Unexamined Patent Application Publication No. 2005-5999, and it shows the configuration of the pattern generator 104 which is used in the above-described two clock and data recovery circuits. The pattern generator 104 includes a counter 141 that receives a clock signal and repeatedly counts from 0 to a predetermined upper limit in synchronization with the clock, an up/down counter 142 that receives the control signal UP3/DOWN3 from the integrator 103 which is formed by an up/down counter and the clock signal and counts up or counts down, and a decoder 143 that receives and decodes the count values from the counter 141 and the up/down counter 142 and outputs it as a result of the frequency tracking loop.

The inventor of the present invention has studied the performance of the frequency tracking loop in the circuits shown in FIGS. 11 and 12 and found the followings.

FIG. 10 shows the jitter tolerance characteristics (which is referred to simply as jitter tolerance) of the circuit shown in FIG. 12 in the case where the count width m of the integrator 102 is 5. In the example shown in FIG. 10, the pattern length p of the pattern generator 104 is 32.

In this case, the jitter tolerance of the circuit shown in FIG. 12 drops abruptly to the jitter at a certain frequency in the intermediate frequency band as shown in FIG. 10.

Due to the existence of such an abrupt drop, the performance of the frequency tracking loop is unstable, which causes failure in extracting an appropriate synchronous clock signal from serial data.

SUMMARY

According to an embodiment of the present invention, there is provided a clock and data recovery circuit. The clock and data recovery circuit includes a clock generator to generate a synchronous clock signal, a phase detector to compare a phase of the synchronous clock signal obtained by the clock generator with a phase of input serial data and obtain a phase error signal corresponding to a comparison result, a phase tracking loop to acquire a phase correction control signal for tracking phase shift of the input serial data based on the phase error signal, and a frequency tracking loop to acquire a frequency correction control signal for tracking frequency shift of the input serial data based on the phase error signal.

The clock generator corrects the phase of the clock signal based on the frequency correction control signal and the phase correction control signal.

The phase tracking loop includes a first integrator. The first integrator is an up/down counter having a predetermined count width, and it smoothes the phase error signal from the phase detector and obtains the phase correction control signal.

The frequency tracking loop includes a pattern generator to count an integral of the first integrator of the phase tracking loop and generate the frequency correction control signal based on a count result. A pattern length of the pattern generator is equal to or larger than a threshold that becomes larger as a count width of the first integrator is larger.

The implementation of the above-described clock and data recovery circuit as a method, an apparatus or a system is also effective as an embodiment of the present invention.

The technique of the present invention stabilizes the performance of the frequency tracking loop in a clock and data recovery circuit which extracts a synchronous clock signal from serial data.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Before describing a specific embodiment of the present invention, principles of the invention will be explained in order to facilitate the understanding of the present invention.

As a result of intensive studies, the inventor of the present invention has established a technique of eliminating the instability of jitter tolerance of a clock and data recovery circuit.

Figure 1:
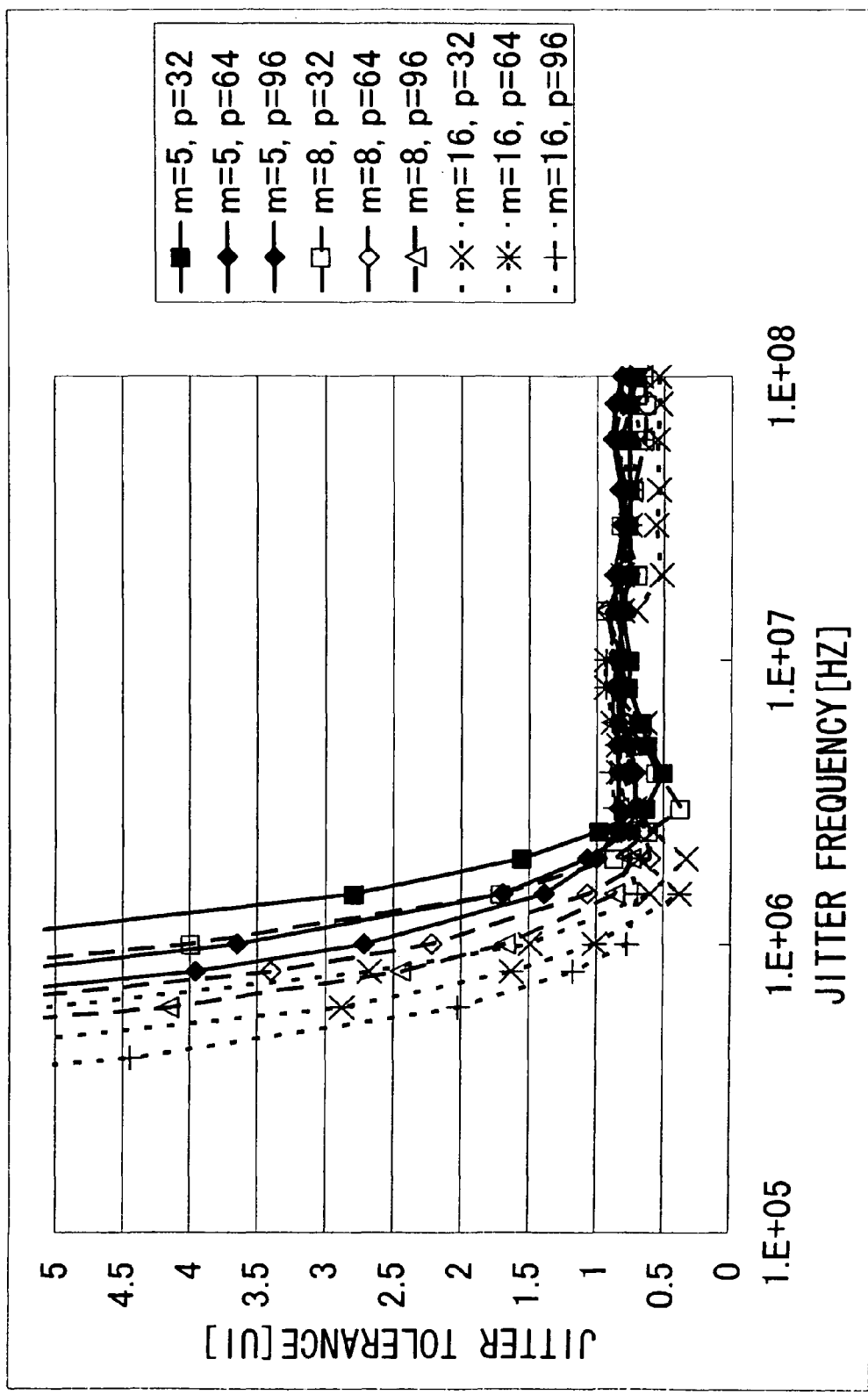
FIG. 1 is an example of a simulation result to explain the principles of the present invention.
Figure 12:
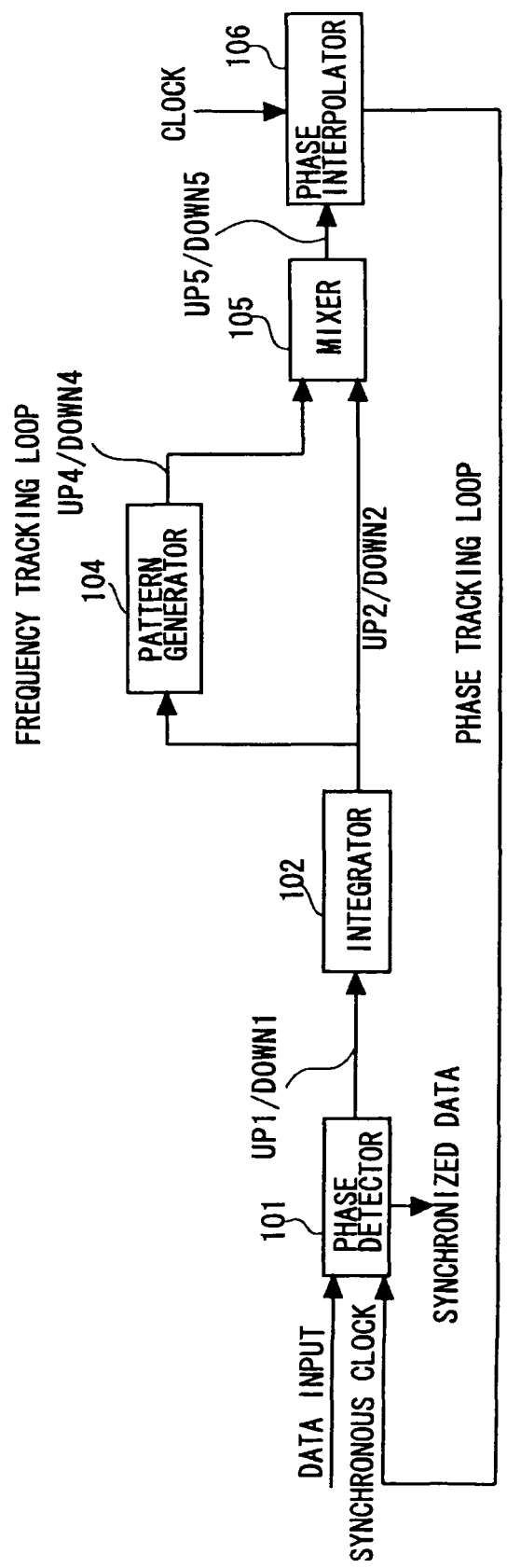
FIG. 12 is a second view showing a clock and data recovery circuit according to a related art.

FIG. 1 shows a simulation result of jitter tolerance of the circuit shown in FIG. 12 when the count width of the integrator 102 is 5, 8 and 16. In FIG. 1, m indicates the count width of the integrator 102, and p indicates the pattern length of the pattern generator 104.

As shown in FIG. 1, when the count width of the integrator 102 is 5, the drop of jitter tolerance occurs if the pattern length of the pattern generator 104 is smaller than 64. On the other hand, the drop of jitter tolerance is not significant if the pattern length of the pattern generator 104 is equal to or larger than 64.

Likewise, when the count width of the integrator 102 is 8, the drop of jitter tolerance occurs if the pattern length of the pattern generator 104 is smaller than 64. On the other hand, the drop of jitter tolerance is not significant if the pattern length of the pattern generator 104 is equal to or larger than 64.

When the count width of the integrator 102 is 16, the drop of jitter tolerance occurs if the pattern length of the pattern generator 104 is smaller than 96. On the other hand, the drop of jitter tolerance is not significant if the pattern length of the pattern generator 104 is equal to or larger than 96.

Thus, the pattern length of the pattern generator 104 can be used as an indicator of the stability of jitter tolerance in the clock and data recovery circuit shown in FIG. 12. If the value of the pattern length is equal to or larger than a predetermined threshold, the jitter tolerance is stabilized. The threshold depends on the count width of the integrator 102, and it becomes larger as the count width of the integrator 102 becomes larger.

Figure 2:
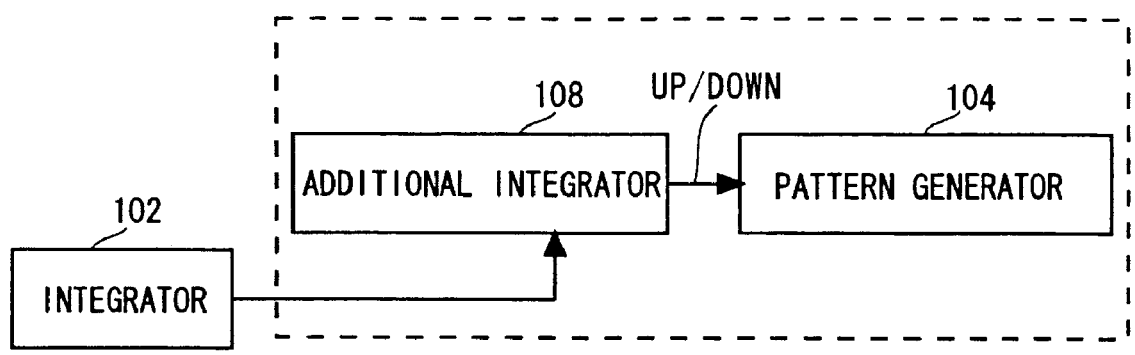
FIG. 2 is a view showing a schematic example of a frequency tracking loop to explain the principles of the present invention.

The inventor of the present invention has also studied the jitter tolerance of a clock and data recovery circuit in another configuration. FIG. 2 is a schematic view showing an example of the frequency tracking loop which is studied by the inventor of the present invention. The frequency tracking loop is an alternative to the frequency tracking loop in the clock and data recovery circuit shown in FIG. 12. For easier understanding, the functional blocks in FIG. 2 are denoted by the same reference symbols as the equivalent blocks of the clock and data recovery circuit shown in FIG. 12, and an integrator 108 which is added to the frequency tracking loop of the clock and data recovery circuit shown in FIG. 12 is referred to as an additional integrator.

Figure 3:
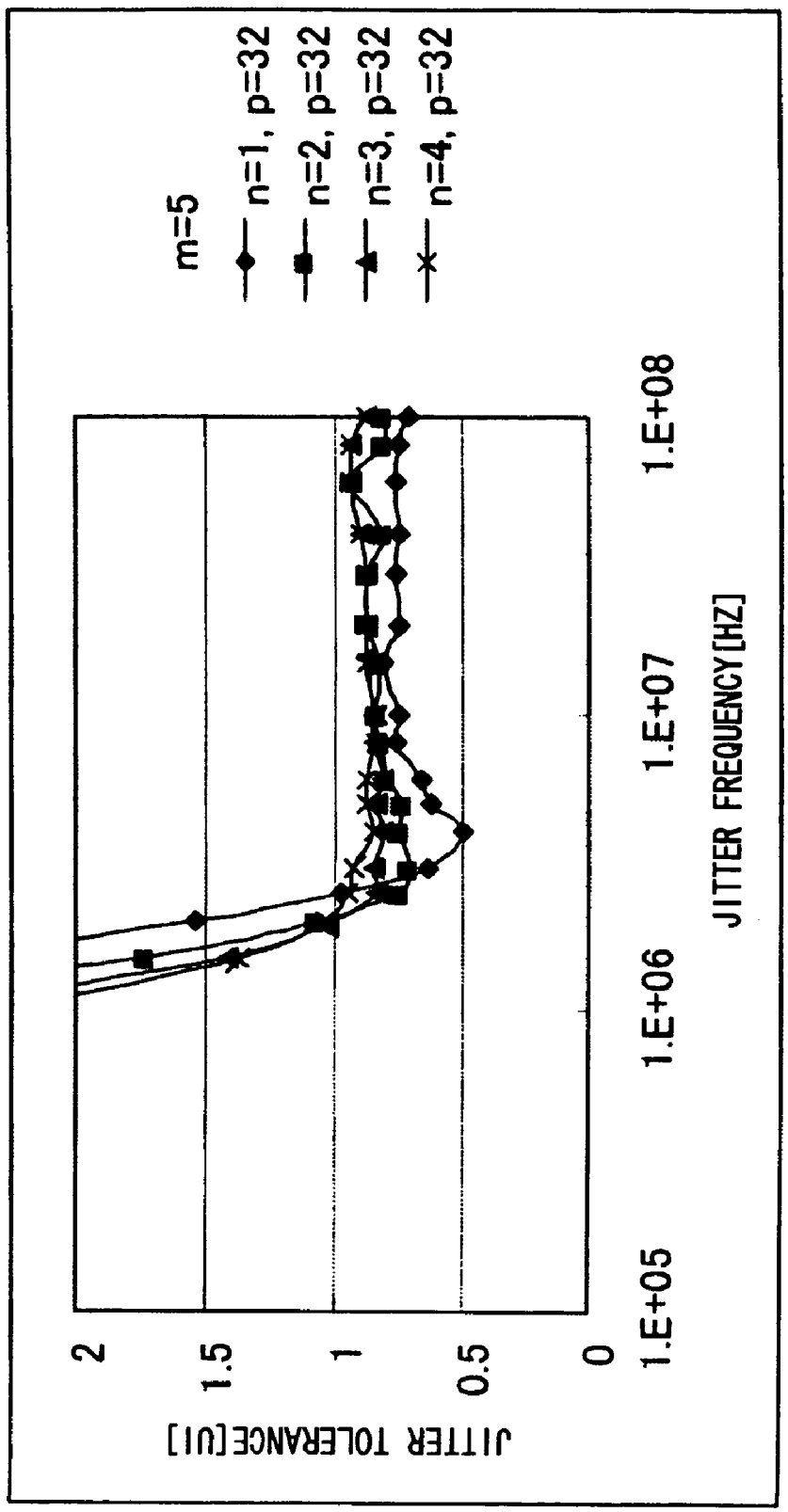
FIG. 3 is a first simulation result showing a factor which affects the stability of jitter tolerance of a circuit having the frequency tracking loop shown in FIG. 2.

FIG. 3 shows an example of a simulation result of jitter tolerance when the count width of the additional integrator 108 is 1, 2, 3 and 4 in the case where the pattern length of the pattern generator 104 is 32 in the frequency tracking loop shown in FIG. 2. In this example, the count width of the integrator 102 is m=5, and n and p in FIG. 3 indicate the count width of the additional integrator 108 and the pattern length of the pattern generator 104, respectively. The count width n="1" indicates the case where the additional integrator 108 is not placed between the pattern generator 104 and the integrator 102.

As shown in FIG. 3, when the count width of the additional integrator 108 is 1, which is the case with the configuration of the clock and data recovery circuit shown in FIG. 12, there is an abrupt drop of the jitter tolerance at a certain frequency in the intermediate frequency band. This is described earlier.

On the other hand, such a drop is not significant when the count width of the additional integrator 108 is equal to or larger than 2.

Figure 4:
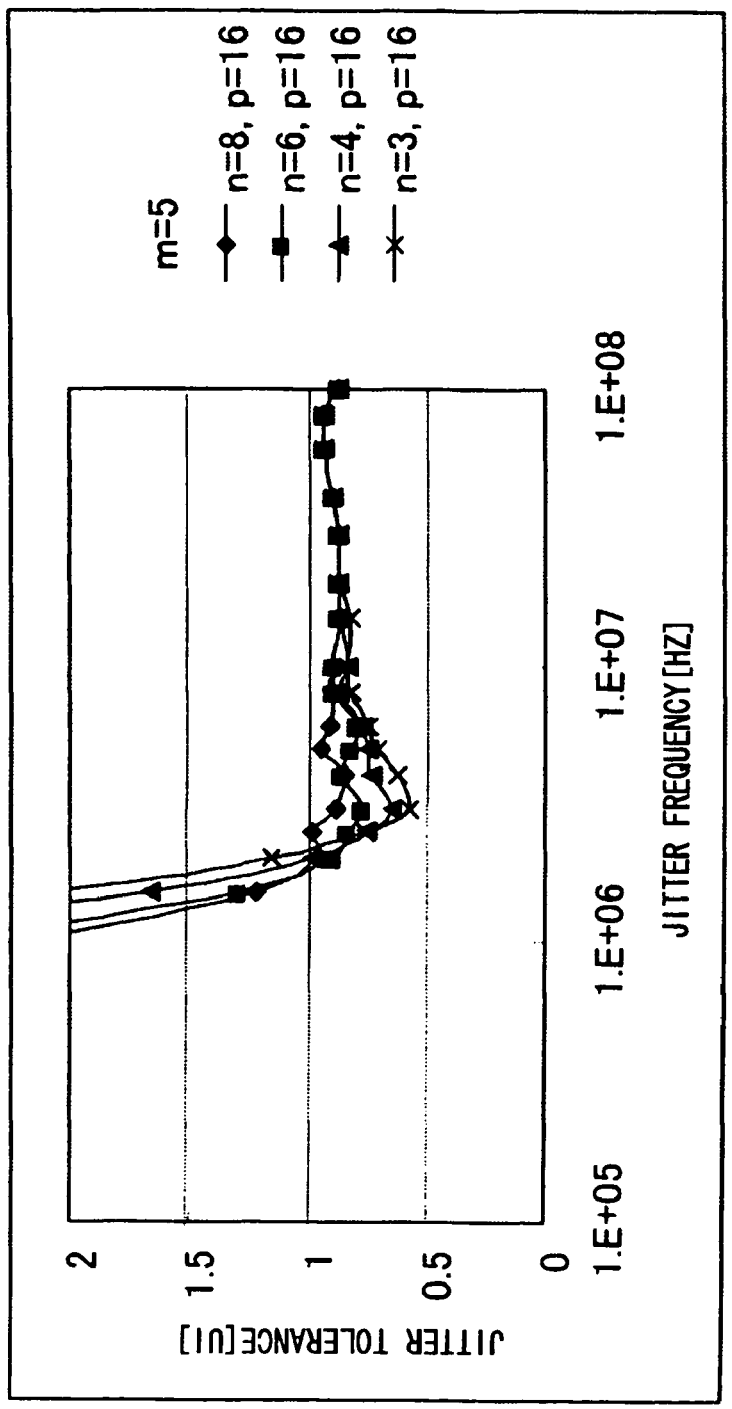
FIG. 4 is a second simulation result showing a factor which affects the stability of jitter tolerance of a circuit having the frequency tracking loop shown in FIG. 2.

FIG. 4 shows jitter tolerance when the count width of the additional integrator 108 is 3, 4, 6 and 8 in the case where the pattern length of the pattern generator 104 is 16 in the frequency tracking loop shown in FIG. 2. As shown in FIG. 4, when the count width of the additional integrator 108 is 3, there is an abrupt drop of the jitter tolerance at a certain frequency in the intermediate frequency band. On the other hand, such a drop is not significant when the count width of the additional integrator 108 is equal to or larger than 4.

Thus, in the frequency tracking loop having the configuration shown in FIG. 2, if the product of the count width of the additional integrator 108 and the pattern length of the pattern generator 104 is equal to or larger than 64 when the count width of the integrator 102 is 5, the drop of the jitter tolerance of the circuit can be prevented.

Figure 5:
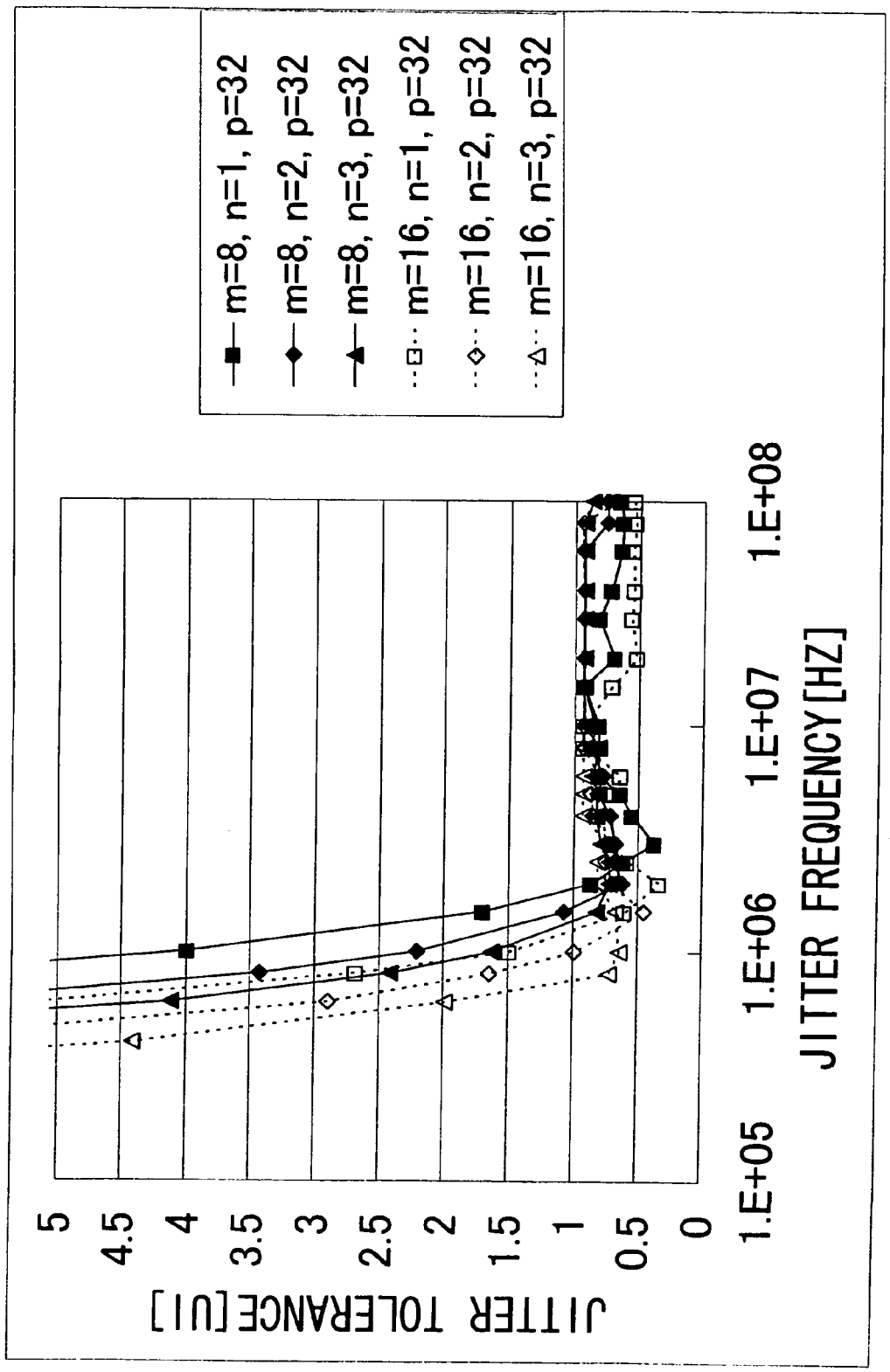
FIG. 5 is a third simulation result showing a factor which affects the stability of jitter tolerance of a circuit having the frequency tracking loop shown in FIG. 2.

FIG. 5 shows an example of a simulation result of jitter tolerance when the count width of the integrator 102 is 8 and 16 in the frequency tracking loop shown in FIG. 2. As shown in FIG. 5, when the count width of the integrator 102 is 8, if the product of the count width of the additional integrator 108 and the pattern length of the pattern generator 104 is equal to or larger than 64, the drop of the jitter tolerance can be prevented. On the other hand, when the count width of the integrator 102 is 16, it is necessary that the product of the count width of the additional integrator 108 and the pattern length of the pattern generator 104 is equal to or larger than 96 in order to prevent the drop of the jitter tolerance.

Thus, in the frequency tracking loop shown in FIG. 2, the product of the pattern length p of the pattern generator 104 and the count width n of the additional integrator 108 can be used as an indicator of the stability of jitter tolerance, and if the value is equal to or larger than a predetermined threshold, the jitter tolerance of the circuit is stabilized. The threshold depends on the count width m of the integrator 102, and it becomes larger as the count width m of the integrator 102 becomes larger.

As described above, the inventor of the present invention has found that the product of the count width n (n>1) of the additional integrator 108 and the pattern length p of the pattern generator 104 can be used as an indicator of the stability of the jitter tolerance of the clock and data recovery circuit using the frequency tracking loop shown in FIG. 2. Further, because when the count width n of the additional integrator 108 is 1, it indicates the case where the additional integrator 108 is not placed, the above finding is also applicable to the jitter tolerance of the clock and data recovery circuit shown in FIG. 12. In the following description, the product of the count width n (n=1) of the additional integrator 108 and the pattern length p of the pattern generator 104 is referred to as a stability coefficient of the jitter tolerance of the clock and data recovery circuit. When the stability coefficient is small, a feedback component with a phase delay by the frequency tracking loop is higher than a feedback component by the phase tracking loop, which can cause the drop of jitter tolerance.

The present invention is made based on the above studies, and it stabilizes jitter tolerance by setting the stability coefficient of jitter tolerance to be equal to or higher than a predetermined threshold which becomes larger as the count width of the integrator (i.e. the integrator 102 in the circuits of FIGS. 2 and 12) which is connected to the phase detector is larger.

Although the circuit shown in FIG. 12 intends to reduce a circuit size by sharing the integrator by the frequency tracking loop and the phase tracking loop, it is necessary to elongate the pattern length of the pattern generator 104 in order to stabilize the jitter tolerance as described above. Therefore, the circuit shown in FIG. 12 cannot necessarily reduce the circuit size.

In light of this, the inventor of the present invention has established the technique of reducing the circuit size in addition to stabilizing the jitter tolerance of the clock and data recovery circuit shown in FIG. 12. The technique is based on the idea of inserting another integrator between the pattern generator 104 and the integrator 102 which is shared by the frequency tracking loop and the phase tracking loop in the clock and data recovery circuit shown in FIG. 12.

The schematic configuration of the frequency tracking loop according to the idea corresponds to the clock and data recovery circuit shown in FIG. 2. The signal which is input to the pattern generator 104 from the additional integrator 108 is referred to as an up/down signal.

The components of the pattern generator 104 are described hereinafter in detail.

Figure 6:
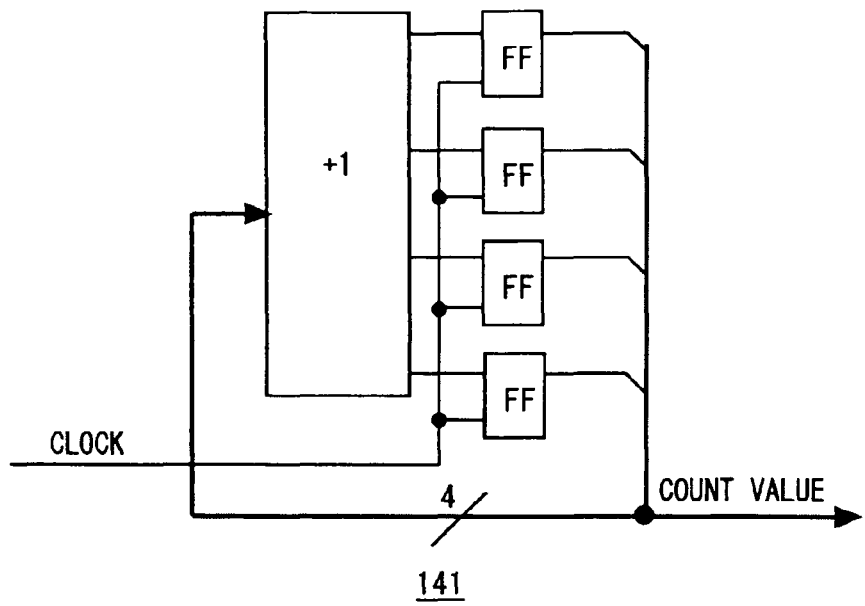
FIG. 6 is a view showing a counter of a pattern generator in the frequency tracking loop shown in FIG. 2.
Figure 7:
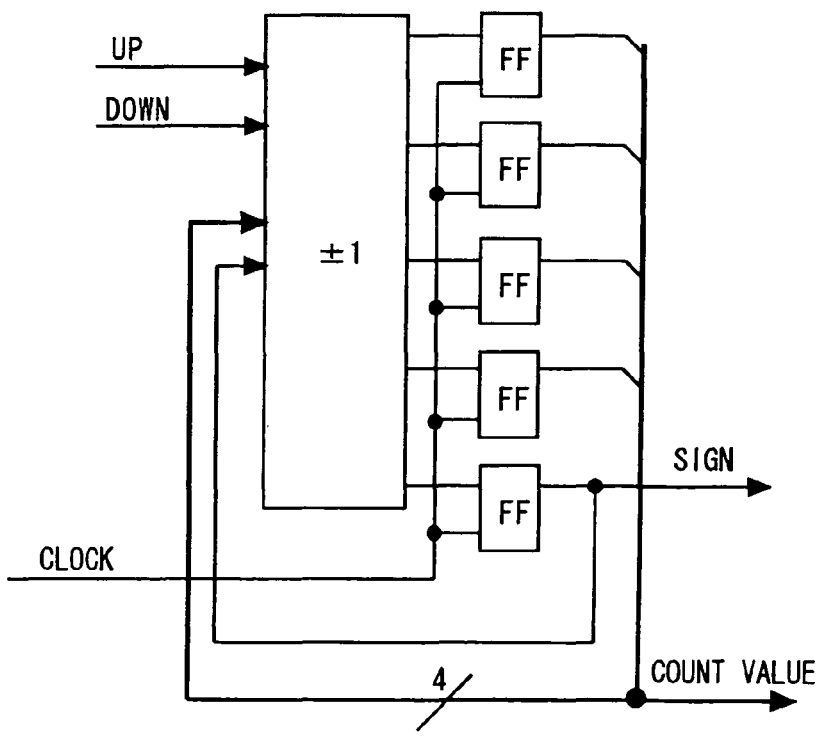
FIG. 7 is a view showing an up/down counter of a pattern generator in the frequency tracking loop shown in FIG. 2.
Figure 13:
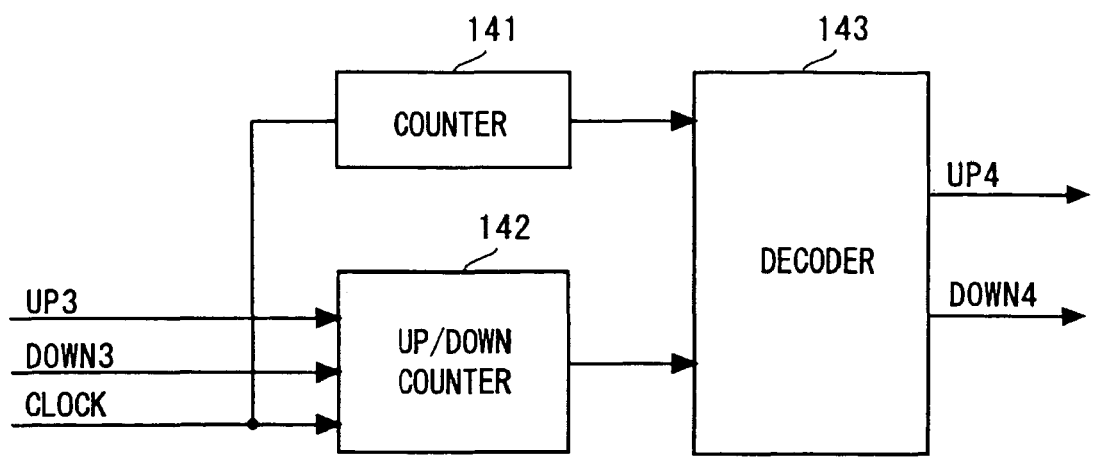
FIG. 13 is a view showing a pattern generator in the clock and data recovery circuit shown in FIGS. 11 and 12.

As shown in FIG. 13, the pattern generator 104 includes a counter 141, an up/down counter 142 and a decoder 143. The counter 141 and the up/down counter 142 are mainly formed by flip-flops (FFs), and the number of FFs included therein corresponds to the pattern length of the pattern generator 104. FIGS. 6 and 7 show the configurations of the counter 141 and the up/down counter 142, respectively, when the pattern length is 16.

In the example of FIG. 6, the count width of the counter 141 is "16", which corresponds to the pattern length of the pattern generator 104. The counter 141 thus counts from "0" to "15". Therefore, the number of FFs included in the counter 141 is 4.

The up/down counter 142 counts from "−15" to "15", which corresponds to the pattern length of the pattern generator 104. Therefore, the number of FFs included in the up/down counter 142 is 5.

If the number of FFs included in the counter 141 is X, the number of FFs included in the up/down counter 142 is Y, and the pattern length of the pattern generator 104 is p, the relationship which is expressed by the following equation is obtained.

$$X = Y - 1$$
$$p = 2^X = 2^{(Y-1)}$$

Equation 1:

where X is the number of FFs included in the counter 141,

Y is the number of FFs included in the up/down counter 142, and p is the pattern length of the pattern generator 104.

Further, if the number of FFs included in the additional integrator 108 shown in FIG. 2 is Z, the count width of the additional integrator 108 is $2^{(Z-1)}$.

In the frequency tracking loop shown in FIG. 2, the total number W of FFs excluding the FFs in the integrator 102 can be expressed by the following equation.

$$W = Z + X + Y = Z + 2Y - 1$$

Equation 2:

where W is the total number of FFs,

X is the number of FFs included in the counter 141,

Y is the number of FFs included in the up/down counter 142, and Z is the number of FFs included in the additional integrator 108.

As described earlier, the product of the count width of the additional integrator 108 and the pattern length of the pattern generator 104 can be used as the stability coefficient of jitter tolerance. As the stability coefficient is larger, the jitter tolerance is more stable. If the stability coefficient is Q, the jitter tolerance coefficient of the circuit using the frequency tracking loop shown in FIG. 2 can be expressed by the following equation.

$$Q = \text{(the count width of the additional integrator 108)} \times \text{(the pattern length of the pattern generator 104)}$$
where Q is a stability coefficient.

Equation 3:

If the count width $2^{(Z-1)}$ of the additional integrator 108 and the pattern length p of the pattern generator 104 represented by Equation 1 are substituted into Equation 3, the following equation is obtained.

$$Q = 2^{(Z+Y-2)}$$

Equation 4:

where Q is a stability coefficient, and

Y is the number of FFs included in the up/down counter 142.

If the additional integrator 108 is not placed in the frequency tracking loop shown in FIG. 2, the count width of the additional integrator 108 in Equation 3 is 1, so that the stability coefficient is the pattern length of the pattern generator 104. If the pattern length of the pattern generator 104 is expressed using the number Y of FFs in the up/down counter 142 as in Equation 2, the following equation is obtained. In the following Equation 5, the stability coefficient and the number of FFs in the up/down counter 142 are indicated by Q1 and Y1, respectively, in order to distinguish from the case where the additional integrator 108 is placed.

$$Q1 = 2^{(Y1-1)}$$

Equation 5:

where Q1 is a stability coefficient, and

Y1 is the number of FFs included in the up/down counter 142.

In this case, the total number W1 of FFs excluding the FFs in the integrator 102 is as shown in the following equation.

$$W1 = X1 + Y1 = 2Y1 - 1$$

Equation 6:

where W1 is the total number of FFs,

X1 is the number of FFs included in the counter 141, and

Y1 is the number of FFs included in the up/down counter 142.

The number of FFs in the section within the dotted line in FIG. 2 when the additional integrator 108 is placed and when it is not placed on the assumption that the jitter tolerance performance is substantially equal is as follows.

Because the jitter tolerance performance is substantially equal, the stability coefficient Q which is expressed by Equation 4 and the stability coefficient Q1 which is expressed by Equation 5 are substantially the same. Therefore, the following equation is derived from the two equations.

$$Y1 = Y + Z - 1 \qquad \text{Equation 7:}$$

where Y1 is the number of FFs included in the up/down counter 142 (when the additional integrator 108 is not placed), Y is the number of FFs included in the up/down counter 142 (when the additional integrator 108 is placed), and Z is the number of FFs included in the additional integrator 108.

From Equations 2 and 6, a difference W0 in the total number of FFs between the two cases is obtained as shown in the following equation.

$$W0 = W1 - W = 2Y1 - Z - 2Y \qquad \text{Equation 8:}$$

where W0 is a difference in the total number of FFs,

W1 is the total number of FFs (when the additional integrator 108 is not placed), and W is the total number of FFs (when the additional integrator 108 is placed).

Substitution of Equation 7 into Equation 8 gives the following equation.

$$W0 = W1 - W = Z - 2 \qquad \text{Equation 9:}$$

where W0 is a difference in the total number of FFs, and

Z is the number of FFs included in the additional integrator 108.

As shown in Equation 9, if the number Z of FFs included in the additional integrator 108 is equal to or larger than 3 (correspondingly, the count width is also equal to or larger than 3), the difference W0 in the total number of FFs is larger than 1. Thus, the total number W of FFs when the additional integrator 108 is placed is smaller by at least one than the total number W1 of FFs when the additional integrator 108 is not placed.

The above result is derived based on the assumption that the jitter tolerance performance is substantially equal. Thus, if the frequency tracking loop shown in FIG. 2 further has the additional integrator 108 which includes three or more FFs, it is possible to reduce the number of FFs and achieves a smaller circuit size while maintaining the same performance as the frequency tracking loop which does not have the additional integrator 108 (i.e. the frequency tracking loop in the clock and data recovery circuit shown in FIG. 12).

Further, on the assumption that the jitter tolerance performance is substantially equal, the pattern length of the pattern generator 104 when the additional integrator 108 is placed is smaller than the pattern length of the pattern generator 104 when the additional integrator 108 is not placed. Thus, when the additional integrator 108 is placed, the number of bits of data which is input to the decoder 143 in the pattern generator 104 is small, so that the circuit size of the decoder 143 is small.

If the number of FFs in the additional integrator 108 is 2, the difference in the total number of FFs is 0, so that the total number W of FFs when the additional integrator 108 is placed and the total number W1 of FFs when the additional integrator 108 is not placed are the same. However, because the pattern length of the pattern generator 104 is small when the additional integrator 108 is placed, the number of bits of data which is input to the decoder 143 is small, so that the circuit size of the decoder 143 is small. Thus, the circuit size is also reduced when the number of FFs in the additional integrator 108 is 2.

The relationship between the pattern length of the pattern generator 104 and the circuit size of the decoder 143 is described in further detail later in the description of a specific embodiment below.

A specific embodiment of the present invention is described hereinafter based on the above findings.

Figure 8:
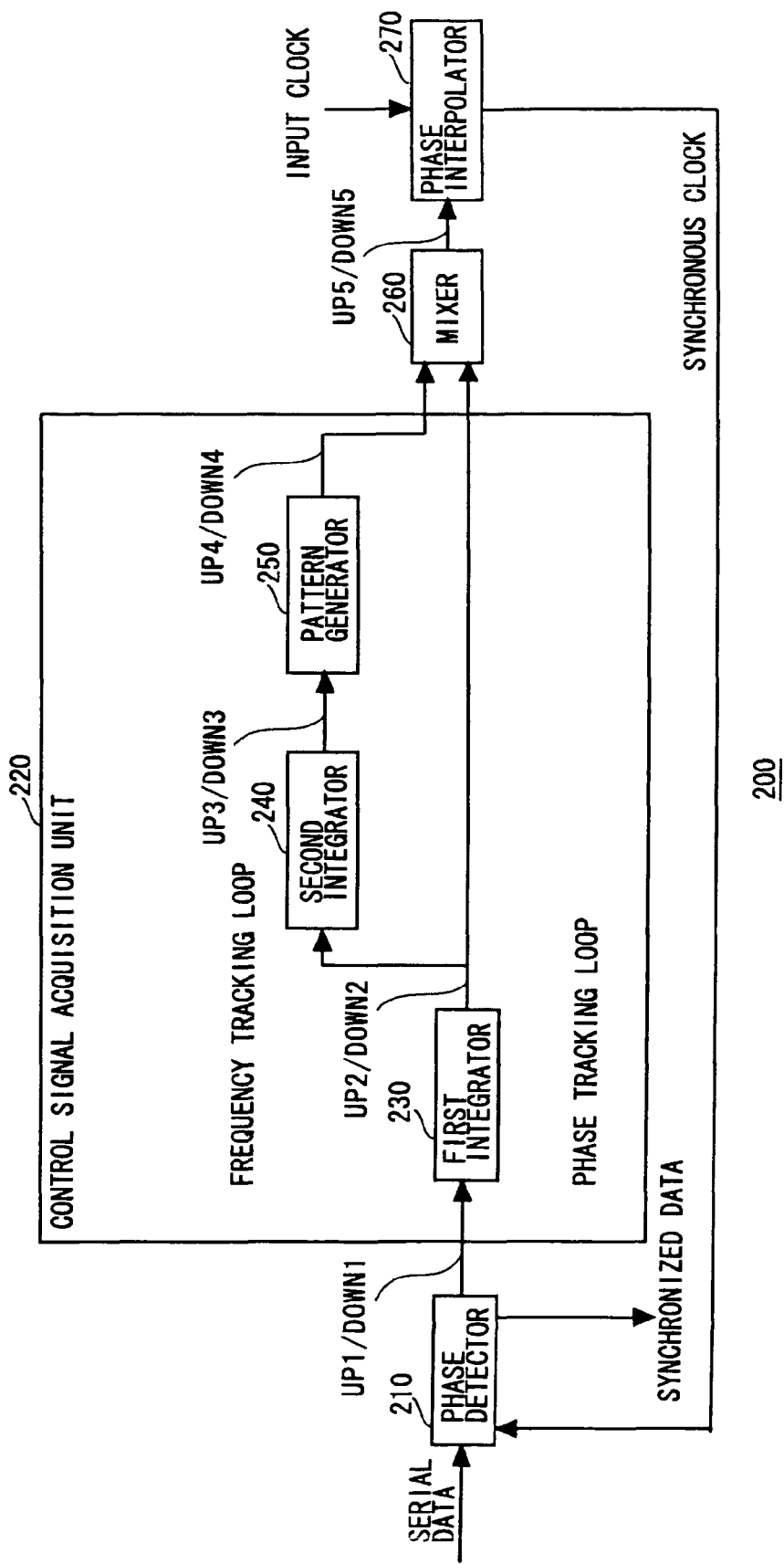
FIG. 8 is a view showing a clock and data recovery circuit according to an embodiment of the present invention.

FIG. 8 shows a clock and data recovery circuit 200 according to an embodiment of the present invention. The clock and data recovery circuit 200 is placed in a receiving device of serial data which is frequency-modulated using a spread spectrum clock, and it extracts a synchronous clock signal from received serial data.

The clock and data recovery circuit 200 includes a phase detector 210, a control signal acquisition unit 220, a mixer 260, and a phase interpolator 270.

The phase interpolator 270 obtains a synchronous clock by changing the phase of an input clock. The phase interpolator 270 thus serves as a clock generator.

The phase detector 210 receives a synchronous clock and serial data. The phase detector 210 compares the phases of the serial data and the synchronous clock, and outputs an up signal or a down signal UP1/DOWN1 which indicates whether the phase of the synchronous clock should be advanced or delayed. Specifically, if the phase of the synchronous clock delays behind the phase of the serial data, the phase detector 210 outputs the up signal UP1 in order to advance the phase of the synchronous clock. On the other hand, if the phase of the synchronous clock is leading ahead of the phase of the serial data, the phase detector 210 outputs the down signal DOWN1 in order to delay the phase of the synchronous clock. The phase detector 210 may further have the function of outputting synchronized data, which is the input serial data synchronized by the synchronous clock, to a serial-to-parallel converter (not shown).

The control signal acquisition unit 220 acquires a phase correction control signal for tracking the phase shift of serial data and a frequency correction control signal for tracking the frequency shift of a serial data signal based on the up/down signal UP1/DOWN1 which is output as a comparison result from the phase detector 210. As shown in FIG. 8, the control signal acquisition unit 220 includes a first integrator 230, a second integrator 240, and a pattern generator 250. The first integrator 230 forms a phase tracking loop and serves as a phase correction control signal acquisition unit that acquires a phase correction control signal. The first integrator 230, the second integrator 240 and the pattern generator 250 form a frequency tracking loop and serve as a frequency correction control signal acquisition unit that acquires a frequency correction control signal.

The first integrator 230 obtains a phase correction control signal UP2/DOWN2 by performing integration of the up/down signal UP1/DOWN1. Because the value of the up/down signal UP1/DOWN1 changes frequently, if the up/down signal UP1/DOWN1 is used as it is for the control of the phase interpolator 270 as a phase correction control signal, the phase of the synchronous clock changes frequently. In light of this, the first integrator 230 functions as a low-pass filter which smoothes the up/down signal UP1/DOWN1 and it prevents the frequent change in the phase of the synchronous clock which is output from the phase interpolator 270. The first integrator 230 is formed by an up/down counter.

The first integrator 230 outputs the phase correction control signal UP2/DOWN2 to the second integrator 240 and the mixer 260.

The integrator 240 smoothes the phase correction control signal UP2/DOWN2 by further performing integration and thereby obtains an up/down signal UP3/DOWN3. The second integrator 240 is also formed by an up/down counter.

The pattern generator 250 detects a difference in frequency between the serial data and the clock from the up/down signal UP3/DOWN3 which is output from the second integrator 240 and outputs an up signal or a down signal UP4/DOWN4 at the frequency which is in proportion to the difference in frequency. The up/down signal UP4/DOWN4 is a frequency correction control signal.

Figure 9:
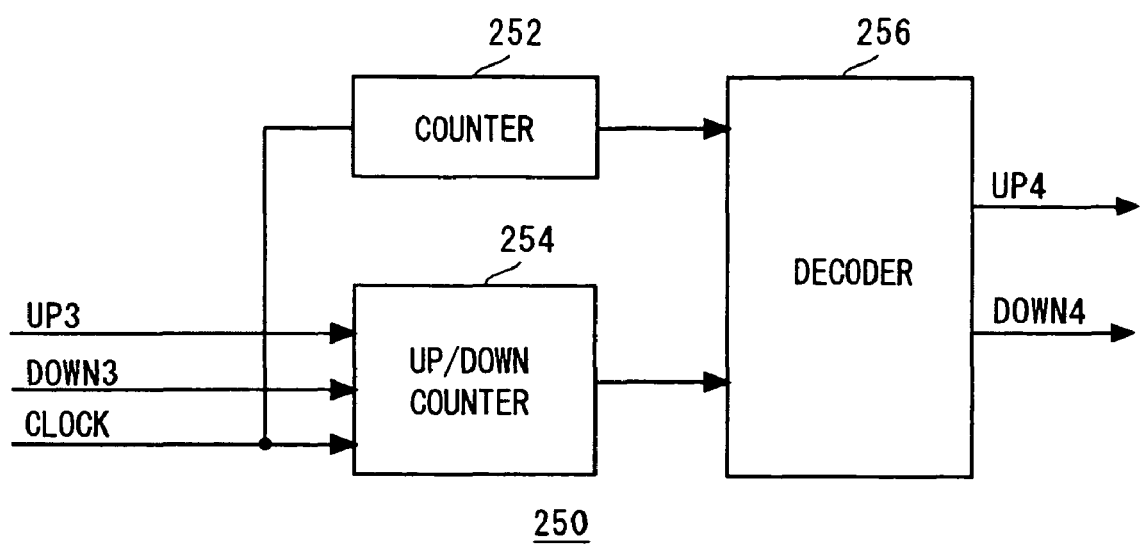
FIG. 9 is a view showing a pattern generator in the clock and data recovery circuit shown in FIG. 8.
Figure 10:
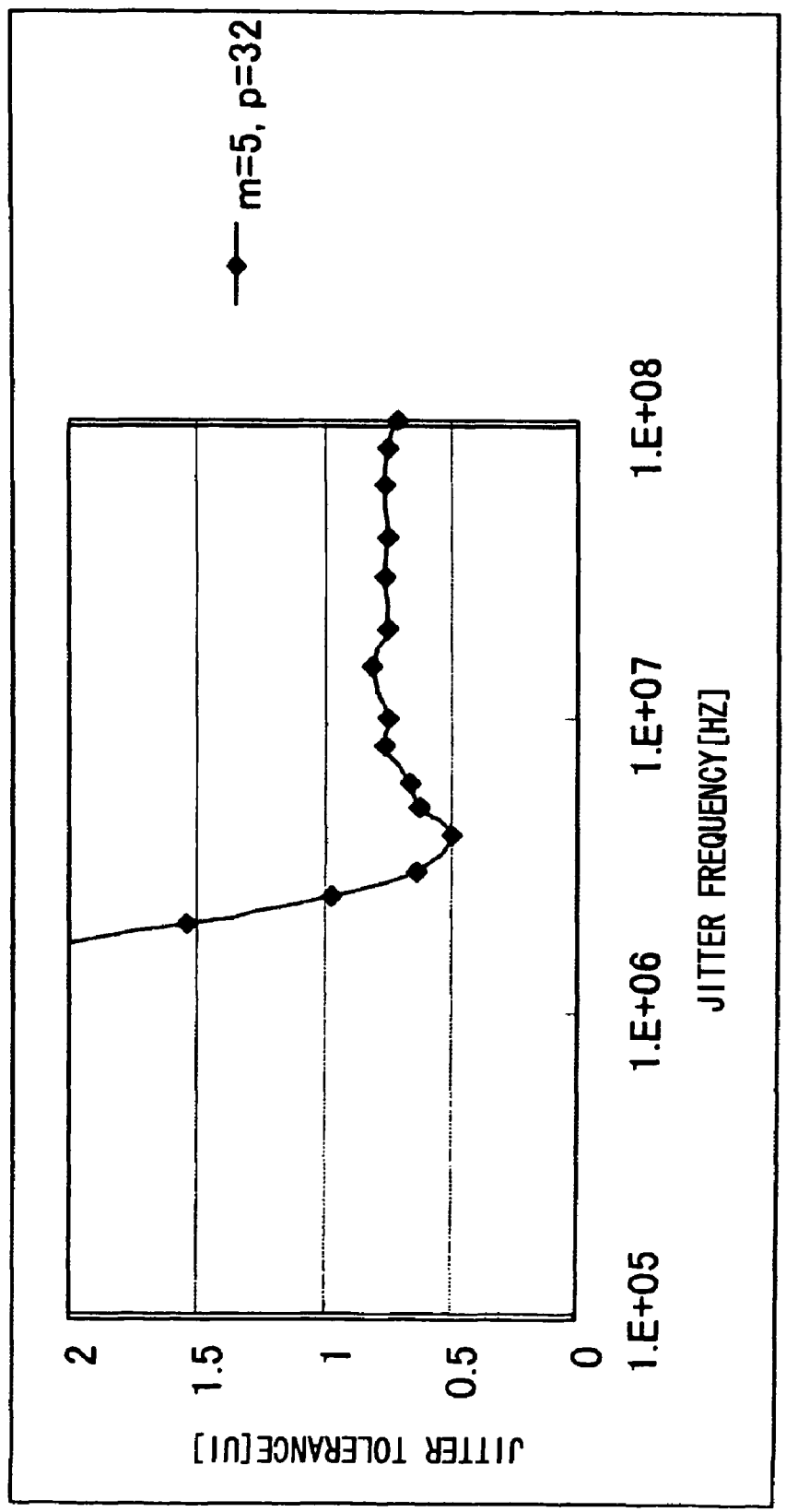
FIG. 10 is a view to explain an issue in a related art.
Figure 11:
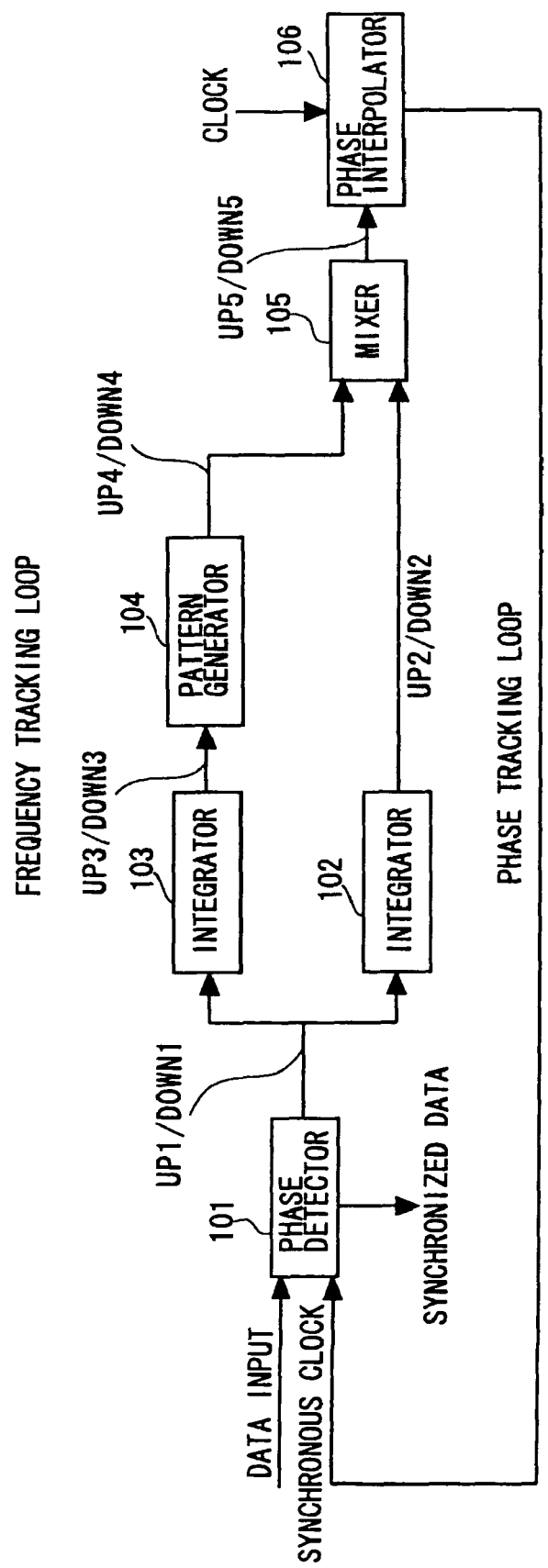
FIG. 11 is a first view showing a clock and data recovery circuit according to a related art.

FIG. 9 shows the configuration of the pattern generator 250. The pattern generator 250 includes a counter 252, an up/down counter 254 and a decoder 256. In this embodiment, the pattern length of the pattern generator 250 is 32. The counter 252 counts from "0" to "31" corresponding to the pattern length, and the count width is 32. The up/down counter 254 also counts from "−31" to "+31" corresponding to the pattern length, and the count width is 32. Five FFs and six FFs are used to form the counter 252 and the up/down counter 254, respectively.

The mixer 260 mixes the phase correction control signal UP2/DOWN2 from the first integrator 230 and the frequency correction control signal UP4/DOWN4 from the pattern generator 250 to obtain a mixed signal UP5/DOWN5 and outputs it to the phase interpolator 270 as a signal for controlling the phase interpolator 270.

The phase interpolator 270 advances or delays the phase of the synchronous clock according to the mixed signal UP5/DOWN5 from the mixer 260.

The operation of the clock and data recovery circuit 200 is described in further detail hereinbelow.

The phase detector 210 outputs UP1=1 when outputting the up signal in order to advance the phase of the clock signal. On the other hand, the phase detector 210 outputs DOWN1=1 when outputting the down signal in order to delay the phase of the clock signal.

The first integrator 230 is an up/down counter. The first integrator 230 counts up when it receives UP1=1 and counts down when it receives DOWN1=1 from the phase detector 210.

It is necessary to use the first integrator 230 with a small count width in order to track the phase shift at high frequencies. As an example, the first integrator 230 counts from "−4" to "+4" and has the count width of 5. Four FFs are used to form the first integrator 230.

When the count value is "4" and UP1=1, the first integrator 230 outputs UP2=1 and sets the count value back to "0" at the next clock. When the count value is "4" and DOWN1=1, the first integrator 230 outputs DOWN2=1 and sets the count value back to "0" at the next clock.

The up/down signal UP2/DOWN2 which is obtained by the first integrator 230 is a phase correction control signal which brings the phase of the clock closer to the phase of the serial data.

The second integrator 240 is also an up/down counter. The second integrator 240 counts up when it receives UP=1 and counts down when it receives DOWN=1 from the first integrator 230. As an example, the second integrator 240 counts from "−3" to "+3" and has the count width of 4. Three FFs are used to form the second integrator 240.

When the count value is "3" and UP2=1, the second integrator 240 outputs UP3=1 and sets the count value back to "0" at the next clock. When the count value is "−3" and DOWN2=1, the second integrator 240 outputs DOWN3=1 and sets the count value back to "0" at the next clock.

The counter 252 of the pattern generator 250 repeatedly counts from "0" to "31" in synchronization with the clock and outputs the count value to the decoder 256.

The up/down counter 254 counts up when UP3=1 and counts down when DOWN3=1 in the range of "−31" to "+31" according to the input up/down signal UP3/DOWN3.

As the number of times when UP3=1 or DOWN3=1 is output successively is greater, a difference in frequency between the serial data and the input clock is larger. Based on the count values of the counter 252 and the up/down counter 254, the decoder 256 outputs the up signal UP4=1 or the down signal DOWN4=1 at the frequency which is in proportion to a difference in frequency between the serial data and the input clock in 32 clocks which correspond to the pattern length. This processing may be performed based on the truth table having the output value (the frequency correction control signal UP4/DOWN4) which corresponds to the combination of the count value of the counter 252 and the up/down signal UP3/DOWN3. In this embodiment, the size of the truth table is "32×63".

The up/down signal UP4/DOWN4 which is obtained by the pattern generator 250 is a frequency correction control signal which brings the frequency of the clock closer to the frequency of the serial data.

The mixer 260 mixes the outputs of the pattern generator 250 and the first integrator 230 to obtain the mixed signal UP5/DOWN5 for controlling the phase interpolator 270.

The phase interpolator 270 changes the phase of the input clock according to the mixed signal UP5/DOWN5. The phase and frequency of the synchronous clock thereby track the phase and frequency of the serial data, so that the synchronous clock is a clock which is extracted from the serial data.

As described above, in the clock and data recovery circuit 200 of this embodiment, the first integrator 230 is shared by the frequency tracking loop and the phase tracking loop, and the second integrator 240 is placed between the pattern generator 250 and the first integrator 230. The count width of the first integrator 230 is 5, the pattern length of the pattern generator 250 is 32, and the count width of the second integrator 240 is 4. Thus, the product of the pattern length (32) of the pattern generator 250 and the count width (4) of the second integrator 240, which is the stability coefficient of jitter tolerance, is equal to or larger than 64, so that the stable jitter tolerance can be obtained.

The circuit size of the clock and data recovery circuit 200 in this embodiment is as follows. In the clock and data recovery circuit 200, the counter 252 and the up/down counter 254 of the pattern generator 250, the second integrator 240 and the first integrator 230 include 5, 6, 3 and 4 FFs, respectively. Thus, the control signal acquisition unit 220 as a whole includes 18 FFs in total. Further, the truth table of the decoder 256 of the pattern generator 250 has the size of "32×63".

The comparison with the clock and data recovery circuit shown in FIG. 12 is as follows. As described in the paragraph [0063] of Japanese Unexamined Patent Application Publication No. 2005-5999, the pattern length of the up/down counter 142 of the pattern generator 104 is 128 in the clock and data recovery circuit. Thus, the counter 141 counts from "0" to "127" and requires 7 FFs, and the up/down counter 142 counts from "−127" to "+127" and requires 8 FFs. The integrator 102 counts from "−4" to "+4" and includes 4 FFs. Thus, the clock and data recovery circuit shown in FIG. 12 uses 19

FFs in total in the frequency tracking loop and the phase tracking loop. Further, the truth table which is used by the decoder 143 of the pattern generator 104 has the size of "128×255", corresponding to the pattern length of the pattern generator 104.

In the clock and data recovery circuit 200, the product of the pattern length of the pattern generator 250 and the count width of the second integrator 240 is 128. In the clock and data recovery circuit shown in FIG. 12, the pattern length of the pattern generator 104 is 128. In both circuits, the count width of the integrator which is shared by the phase tracking loop and the frequency tracking loop (i.e. the first integrator 230 in FIG. 8 and the integrator 102 in FIG. 12) is 5. Therefore, the performance of the phase tracking loop and the performance of the frequency tracking loop are substantially the same between the two circuits.

Therefore, the clock and data recovery circuit 200 according to the embodiment of the present invention can achieve substantially the same performance as the clock and data recovery circuit shown in FIG. 12 with the use of a smaller number of FFs than in the clock and data recovery circuit shown in FIG. 12.

Further, in the clock and data recovery circuit 200, the size of the truth table of the decoder 256 in the pattern generator 250 is "32×63". In the clock and data recovery circuit shown in FIG. 12, the size of the truth table of the decoder 143 in the pattern generator 104 is "128×255". Therefore, the amount of operation is greater, and thus the circuit size is larger, in the decoder 143 than in the decoder 256.

As described in the foregoing, the clock and data recovery circuit 200 shown in FIG. 8 enables the reduction of circuit size in addition to the stabilization of jitter tolerance.

As described in the explanation of the principles, when the number of FFs which is used in the integrator that is added according to the embodiment of the present invention (i.e. the second integrator 240 in FIG. 8) is 2, the second integrator 240 counts from "−1" to "+1", and the count width is 2. In this case, the number of FFs which is necessary in the frequency tracking loop and the phase tracking loop in the clock and data recovery circuit 200 shown in FIG. 8 and the number of FFs which is necessary in the frequency tracking loop and the phase tracking loop in the circuit shown in FIG. 12 are the same. However, because the size of the truth table of the decoder 256 in the clock and data recovery circuit 200 is smaller, the size of the decoder 256 is smaller. Therefore, the circuit size of the clock and data recovery circuit 200 is smaller than that of the clock and data recovery circuit shown in FIG. 12 in this case as well.

Although the embodiments of the present invention are described in the foregoing, the present invention is not restricted to the above-described embodiments, and various changes and modifications may be made without departing from the scope of the invention. All such changes and modifications as would be obvious to one skilled in the art are intended for inclusion within the scope of the present invention.

For example, although the count width of the second integrator 240 is 4, the number of FFs is 3, and the pattern length of the pattern generator 250 is 32 in the clock and data recovery circuit 200, the count width of the second integrator 240 and the pattern length of the pattern generator 250 may be 8 and 16, respectively. In this case, the number of FFs in the second integrator 240, the counter 252 and the up/down counter 254 of the pattern generator 250 is 4, 4, 5, respectively, and the total number of FFs in the control signal acquisition unit 220 is 17. Further, the size of the truth table which is used by the decoder 256 in the pattern generator 250 is "16×31". Further, the product of the count width of the second integrator 240 and the pattern length of the pattern generator 250 is 128, which is equal to or larger than 64. It is thereby possible to prevent the drop of the jitter tolerance of the frequency tracking loop in addition to reduce the circuit size.

It is apparent that the present invention is not limited to the above embodiments, but may be modified and changed without departing from the scope and spirit of the invention.

What is claimed is:

1. A clock and data recovery circuit, comprising:
   a clock generator to generate a synchronous clock signal;
   a phase detector to compare a phase of the synchronous clock signal obtained by the clock generator with a phase of input serial data and to obtain a phase error signal corresponding to a comparison result;
   a phase tracking loop to acquire a phase correction control signal for tracking a phase shift of the input serial data based on the phase error signal; and
   a frequency tracking loop to acquire a frequency correction control signal for tracking a frequency shift of the input serial data based on the phase error signal, wherein
   the clock generator corrects the phase of the synchronous clock signal based on the frequency correction control signal and the phase correction control signal,
   the phase tracking loop includes a first integrator, being an up/down counter having a predetermined count width, to smooth the phase error signal and obtain the phase correction control signal,
   the frequency tracking loop includes a pattern generator to count an integral of the first integrator and generate the frequency correction control signal based on a first count result,
   a pattern length of the pattern generator is equal to or larger than a threshold that becomes larger as the count width of the first integrator becomes larger,
   the frequency tracking loop further includes a second integrator, being an up/down counter having a predetermined count width, to smooth the integral of the first integrator,
   the pattern generator counts an integral of the second integrator and generates the frequency correction control signal based on a second count result in combination with said first count result, and
   a product of the pattern length of the pattern generator and the count width of the second integrator is equal to or larger than the threshold.

2. The clock and data recovery circuit according to claim 1, wherein
   the phase error signal includes an up signal indicating a need for advancing the phase of the synchronous clock signal and a down signal indicating a need for delaying the phase of the synchronous clock signal.

3. The clock and data recovery circuit according to claim 1, wherein
   the phase error signal includes an up signal indicating that the phase of the synchronous clock signal lags and a down signal indicating that the phase of the synchronous clock signal leads.

4. The clock and data recovery circuit according to claim 1, wherein the count width of the second integrator is equal to or larger than 3.

* * * * *